(12) United States Patent
Kim et al.

(10) Patent No.: US 9,997,234 B1
(45) Date of Patent: Jun. 12, 2018

(54) SEMICONDUCTOR DEVICES

(71) Applicant: SK hynix Inc., Icheon-si, Gyeonggi-do (KR)

(72) Inventors: Yong Mi Kim, Hwaseong-si (KR); Jaeil Kim, Yongin-si (KR); Jae In Lee, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days. days.

(21) Appl. No.: 15/654,917

(22) Filed: Jul. 20, 2017

(30) Foreign Application Priority Data

Jan. 23, 2017 (KR) .......................... 10-2017-0010732

(51) Int. Cl.
| | | |
|---|---|---|
| *G11C 7/10* | (2006.01) | |
| *G11C 11/4096* | (2006.01) | |
| *G11C 11/4076* | (2006.01) | |
| *G11C 11/4093* | (2006.01) | |
| *G11C 16/04* | (2006.01) | |
| *G06F 1/24* | (2006.01) | |
| *G11C 7/06* | (2006.01) | |

(52) U.S. Cl.
CPC ............ *G11C 11/4096* (2013.01); *G06F 1/24* (2013.01); *G11C 7/065* (2013.01); *G11C 7/1027* (2013.01); *G11C 7/1039* (2013.01); *G11C 11/4076* (2013.01); *G11C 11/4093* (2013.01); *G11C 16/04* (2013.01)

(58) Field of Classification Search
CPC ........... G11C 7/10; G11C 7/1042; G11C 7/22; G11C 7/222; G11C 8/10; G11C 11/4093

USPC .... 365/233, 230.04, 230.06, 189.14, 189.18, 365/233.11
See application file for complete search history.

(56) References Cited

U.S. PATENT DOCUMENTS

| | | | | |
|---|---|---|---|---|
| 5,471,429 | A * | 11/1995 | Lee ........................ | G11C 29/34 365/201 |
| 6,909,665 | B2 * | 6/2005 | Lee .......................... | G11C 7/10 365/189.14 |
| 9,520,167 | B2 * | 12/2016 | Park ..................... | G11C 11/4076 |
| 9,633,750 | B2 * | 4/2017 | Park ....................... | G11C 29/78 |
| 2011/0252171 | A1 | 10/2011 | Dearth et al. | |
| 2016/0071564 | A1 * | 3/2016 | Park .................... | G11C 11/4076 365/189.05 |

FOREIGN PATENT DOCUMENTS

KR 20160055549 A 5/2016

\* cited by examiner

*Primary Examiner* — Gene Auduong
(74) *Attorney, Agent, or Firm* — William Park & Associates Ltd.

(57) ABSTRACT

A semiconductor device includes a control signal generation circuit and an input/output (I/O) control circuit. The control signal generation circuit generates first and second read control signals and first and second write control signals. One of the first and second read control signals and one of the first and second write control signals is selectively enabled according to a combination of first and second addresses for selecting a first I/O line or a second I/O line. The I/O control circuit outputs read data loaded on first and second internal I/O lines through any one of the first and second I/O lines in response to the first and second read control signals. In addition, the I/O control circuit outputs input data through any one of the first and second I/O lines in response to the first and second write control signals.

20 Claims, 10 Drawing Sheets

FIG. 2

|  | ADD<1> | ADD<2> |
|---|---|---|
| FIRST MODE (X8) | H | H |
| SECOND MODE (X4) | H | L |
| THIRD MODE (X4) | L | H |

SEMICONDUCTOR DEVICES

CROSS-REFERENCE TO RELATED APPLICATIONS

The present application claims priority under 35 U.S.C 119(a) to Korean Application No. 10-2017-0010732, filed on Jan. 23, 2017, which is incorporated herein by reference in its entirety.

BACKGROUND

1. Technical Field

Embodiments of the present disclosure relate to semiconductor devices executing a read-modify-write operation.

2. Related Art

Recently, a DDR2 scheme or a DDR3 scheme for receiving and outputting four-bit data or eight-bit data during each clock cycle time has been used to improve an operation speed of semiconductor devices. If a data transmission speed of the semiconductor devices becomes faster, probability of error occurrence may increase while the data is transmitted in the semiconductor devices. Accordingly, novel design schemes may be required to guarantee the reliable transmission of the data.

Whenever the data are transmitted in semiconductor devices, error codes which are capable of detecting occurrence of errors may be generated and transmitted with the data to improve the reliability of data transmission. The error codes may include an error detection code (EDC) which is capable of detecting errors and an error correction code (ECC) which is capable of correcting the errors by itself.

Meanwhile, the semiconductor devices may be designed to execute a read-modify-write operation. According to the read-modify-write operation, a write operation may begin to store data into predetermined memory cells when a read operation for reading out data stored in the predetermined memory cells terminates. In such a case, it may be meaningless that the data stored into the predetermined memory cells during the write operation are identical to the data outputted from the predetermined memory cells during the read operation. Thus, after the data stored in the predetermined memory cells are read out, it may be necessary to correct errors of the data outputted from the predetermined memory cells and to perform a write operation for storing the corrected data into the predetermined memory cells.

SUMMARY

Various embodiments are directed to semiconductor devices executing a read-modify-write operation.

According to an embodiment, a semiconductor device includes a control signal generation circuit and an input/output (I/O) control circuit. The control signal generation circuit generates first and second read control signals and first and second write control signals. One of the first and second read control signals and one of the first and second write control signals is selectively enabled according to a combination of first and second addresses for selecting a first I/O line or a second I/O line. The I/O control circuit outputs read data loaded on first and second internal I/O lines through any one of the first and second I/O lines in response to the first and second read control signals. In addition, the I/O control circuit outputs input data through any one of the first and second I/O lines in response to the first and second write control signals.

According to another embodiment, a semiconductor device includes a control signal generation circuit and an input/output (I/O) control circuit. The control signal generation circuit generates first and second read control signals and first and second write control signals which are simultaneously enabled if a combination of first and second addresses corresponds to a first mode. In addition, the control signal generation circuit generates the first and second read control signals and the first and second write control signals even if a combination of the first and second addresses corresponds to a second mode or a third mode. In such a case, one of the first and second read control signals and one of the first and second write control signals are selectively enabled in the second or third mode. The input/output (I/O) control circuit outputs read data loaded on first and second internal I/O lines through first and second I/O lines in response to the first and second read control signals. Moreover, the I/O control circuit outputs input data through the first and second I/O lines in response to the first and second write control signals.

BRIEF DESCRIPTION OF THE DRAWINGS

Various embodiments of the present disclosure will become more apparent in view of the attached drawings and accompanying detailed description, in which:

FIG. 2 is a table illustrating various modes according to a logic level combination of an address used in an embodiment;

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
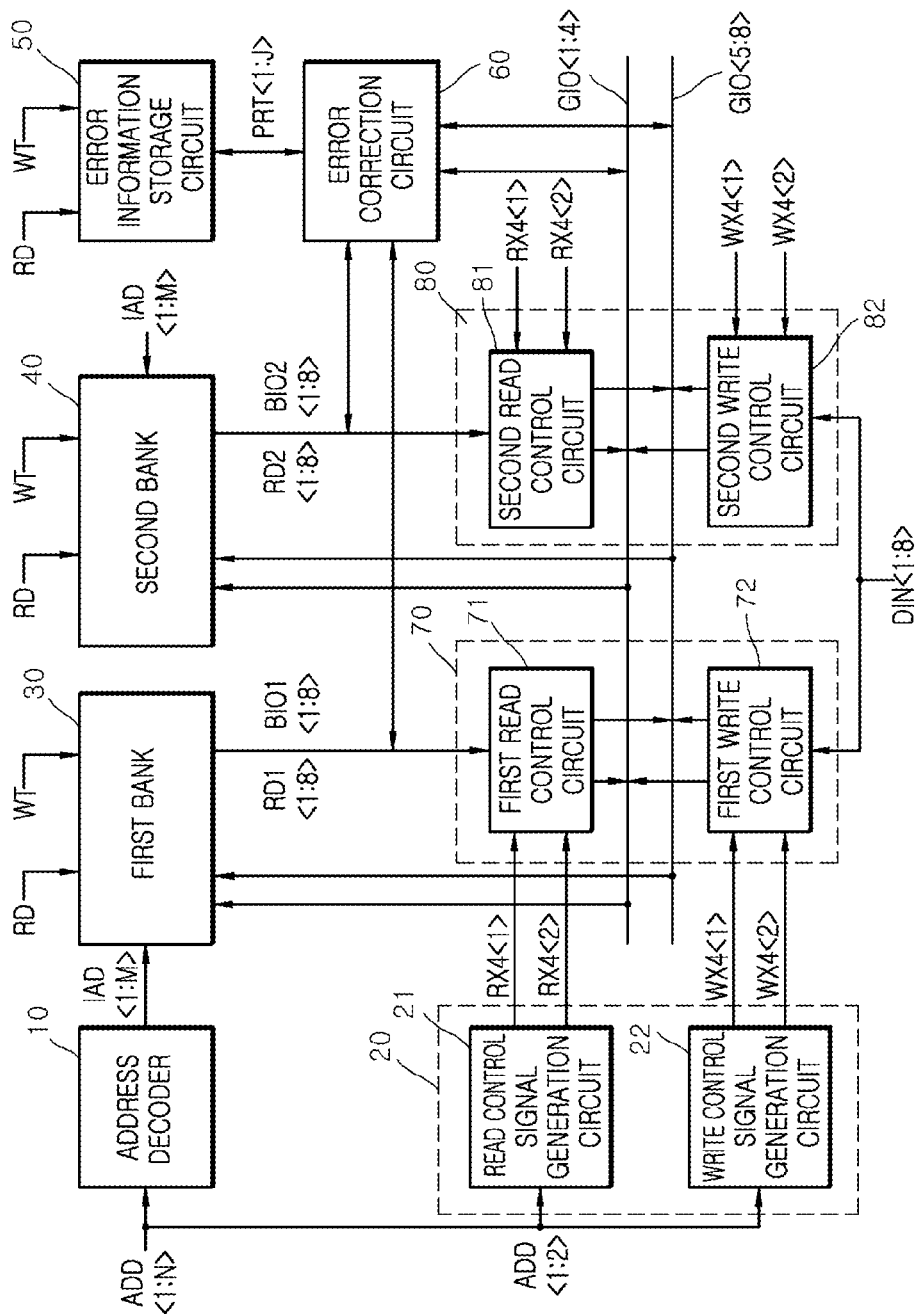
FIG. 1 is a block diagram illustrating a configuration of a semiconductor device according to an embodiment of the present disclosure.

As illustrated in FIG. 1, a semiconductor device according to an embodiment may include an address decoder 10, a control signal generation circuit 20, a first bank 30, a second bank 40, an error information storage circuit 50, an error correction circuit 60, a first input/output (I/O) control circuit 70, and a second I/O control circuit 80.

The address decoder 10 may decode an address ADD<1: N> to generate an internal address IAD<1:M>. The address ADD<1:N> may be a signal which is received from an external device or an external system. The number "N" of bits included in the address ADD<1:N> may be set to be a natural number and may be set to be different according to the embodiment. The number "M" of bits included in the internal address IAD<1:M> may be set to be a natural number and may be set to be different according to the embodiment. A first address ADD<1> of the address ADD<1:N> may be set to be an address for activating a first I/O line GIO<1:4>. A second address ADD<2> of the address ADD<1:N> may be set to be an address for activating a second I/O line GIO<5:8>.

The control signal generation circuit 20 may include a read control signal generation circuit 21 and a write control signal generation circuit 22.

The read control signal generation circuit 21 may buffer the first and second addresses ADD<1:2> to generate first and second read control signals RX4<1:2> during an internal read operation. The read control signal generation circuit 21 may inversely buffer the first and second addresses ADD<1:2> to generate the first and second read control signals RX4<1:2> during a write operation.

The write control signal generation circuit 22 may buffer the first and second addresses ADD<1:2> to generate first and second write control signals WX4<1:2> during the internal read operation. The write control signal generation circuit 22 may buffer the first and second addresses ADD<1: 2> to generate the first and second write control signals WX4<1:2> during the write operation.

The control signal generation circuit 20 may generate the first and second read control signals RX4<1:2> according to a logic level combination of the first and second addresses ADD<1:2> for selecting and activating the first and second I/O lines GIO<1:8>. The control signal generation circuit 20 may generate the first and second write control signals WX4<1:2> according to a logic level combination of the first and second addresses ADD<1:2> for selecting and activating the first and second I/O lines GIO<1:8>. The control signal generation circuit 20 may generate the first and second read control signals RX4<1:2> which are simultaneously enabled according to a logic level combination of the first and second addresses ADD<1:2> in a first mode. The control signal generation circuit 20 may generate the first and second read control signals RX4<1:2> which may be simultaneously enabled if a combination of first and second addresses ADD<1:2> corresponds to the first mode. The control signal generation circuit 20 may generate the first and second write control signals WX4<1:2> which are simultaneously enabled according to a logic level combination of the first and second addresses ADD<1:2> in the first mode. The control signal generation circuit 20 may generate the first and second write control signals WX4<1:2> which may be simultaneously enabled if a combination of first and second addresses ADD<1:2> corresponds to a first mode. The control signal generation circuit 20 may generate the first and second read control signals RX4<1:2>, one of which is selectively enabled if a logic level combination of the first and second addresses ADD<1:2> in a second or third mode. The control signal generation circuit 20 may generate the first and second write control signals WX4<1: 2>, one of which is selectively enabled if a logic level combination of the first and second addresses ADD<1:2> in the second or third mode. The first to third modes will be described in detail with reference to FIG. 2 later.

The first bank 30 may output the data stored therein as first read data RD1<1:8> according to the internal address IAD<1:M>, in response to a read signal RD which is enabled during the internal read operation. The first read data RD1<1:8> may be outputted through first and second internal I/O lines BIO1<1:8>. The first internal I/O line corresponds to an internal I/O line BIO1<1:4> of the first and second internal I/O lines BIO1<1:8>. The second internal I/O line corresponds to an internal I/O line BIO1<5:8> of the first and second internal I/O lines BIO1<1:8>. The first bank 30 may store input data DIN<1:8> loaded on the first and second I/O lines GIO<1:8> according to the internal address IAD<1:M>, in response to a write signal WT which is enabled during the write operation. The first I/O line corresponds to the I/O line GIO<1:4> of the first and second I/O lines GIO<1:8>. The second I/O line corresponds to the I/O line GIO<5:8> of the first and second I/O lines GIO<1: 8>.

The second bank 40 may output the data stored therein as second read data RD2<1:8> according to the internal address IAD<1:M>, in response to the read signal RD which is enabled during the internal read operation. The second read data RD2<1:8> may be outputted through third and fourth internal I/O lines BIO2<1:8>. The third internal I/O line corresponds to an internal I/O line BIO2<1:4> of the third and fourth internal I/O lines BIO2<1:8>. The fourth internal I/O line corresponds to an internal I/O line BIO2<5: 8> of the third and fourth internal I/O lines BIO2<1:8>. The second bank 40 may store the input data DIN<1:8> loaded on the first and second I/O lines GIO<1:8> according to the internal address IAD<1:M>, in response to the write signal WT which is enabled during the write operation.

The error information storage circuit 50 may output a parity signal PRT<1:J> stored therein, in response to the read signal RD. The error information storage circuit 50 may store the parity signal PRT<1:J> in response to the write signal WT. The parity signal PRT<1:J> may be set to include error information on the first read data RD1<1:8> and the second read data RD2<1:8>. The parity signal PRT<1:J> may be set to include error information on the input data DIN<1:8>. The number "J" of bits included in the parity signal PRT<1:J> may be set to be a natural number and may be set to be different according to the embodiment.

The error correction circuit 60 may correct errors of the first read data RD1<1:8> loaded on the first and second internal I/O lines BIO1<1:8>, in response to the parity signal PRT<1:J> during the internal read operation. The error correction circuit 60 may output the corrected first read data RD1<1:8> through the first and second internal I/O lines BIO1<1:8> during the internal read operation. The error correction circuit 60 may correct errors of the second read data RD2<1:8> loaded on the third and fourth internal I/O lines BIO2<1:8>, in response to the parity signal PRT<1:J> during the internal read operation. The error correction circuit 60 may output the corrected second read data RD2<1: 8> through the third and fourth internal I/O lines BIO2<1:8> during the internal read operation. The error correction circuit 60 may generate the parity signal PRT<1:J> including information on errors of the input data DIN<1:8> loaded on the first and second I/O lines GIO<1:8> during the write operation. The error correction circuit 60 may correct errors of the input data DIN<1:8> loaded on the first and second I/O lines GIO<1:8> during the write operation. The error correction circuit 60 may output the corrected input data DIN<1:8> through the first and second I/O lines GIO<1:8> during the write operation.

The first I/O control circuit 70 may include a first read control circuit 71 and a first write control circuit 72.

The first read control circuit 71 may output the first read data RD1<1:8> loaded on the first and second internal I/O lines BIO1<1:8> through the first and second I/O lines GIO<1:8>, in response to the first and second read control signals RX4<1:2>. The first read control circuit 71 may output the first read data RD1<1:8> loaded on the first and second internal I/O lines BIO1<1:8> through the first and second I/O lines GIO<1:8>, in response to the first and second read control signals RX4<1:2> in the first mode. The first read control circuit 71 may output the first read data RD1<1:4> loaded on the first internal I/O line BIO1<1:4> through the first I/O line GIO<1:4>, in response to the first and second read control signals RX4<1:2> during the internal read operation in the second mode. The first read control circuit 71 may output the first read data RD1<5:8> loaded on the second internal I/O line BIO1<5:8> through the second I/O line GIO<5:8>, in response to the first and second read control signals RX4<1:2> during the write operation in the second mode. The first read control circuit 71 may output the first read data RD1<5:8> loaded on the second internal I/O line BIO1<5:8> through the second I/O line GIO<5:8>, in response to the first and second read control signals RX4<1:2> during the internal read operation in the third mode. The first read control circuit 71 may output the first read data RD1<1:4> loaded on the first internal I/O line BIO1<1:4> through the first I/O line GIO<1:4>, in response to the first and second read control signals RX4<1:2> during the write operation in the third mode.

The first write control circuit 72 may output the input data DIN<1:8> through at least one of the first and second I/O lines GIO<1:8> in response to the first and second write control signals WX4<1:2>. The first write control circuit 72 may output the input data DIN<1:8> through any one of the first and second I/O lines GIO<1:8>, on which the read data RD1<1:8> are not loaded, in response to the first and second write control signals WX4<1:2> in the first mode. The first write control circuit 72 may output the input data DIN<1:4> through the first I/O line GIO<1:4> in response to the first and second write control signals WX4<1:2> during the write operation in the second mode. The first write control circuit 72 may output the input data DIN<5:8> through the second I/O line GIO<5:8> in response to the first and second write control signals WX4<1:2> during the write operation in the third mode.

The first I/O control circuit 70 may output the first read data RD1<1:8> loaded on the first and second internal I/O lines BIO1<1:8> through at least one of the first and second I/O lines GIO<1:8>, in response to the first and second read control signals RX4<1:2> in the first mode. Generally, if the number of bits included in the first read data RD1<1:8> and the number of bits included in the input data DIN<1:8> is "N" in the first mode, the number of bits included in the input data DIN<1:8> is "N/2" in the second or third mode (where, "N" denotes a natural number and an even number). The first I/O control circuit 70 may output the first read data RD1<1:8> loaded on the first and second internal I/O lines BIO1<1:8> through any one of the first and second I/O lines GIO<1:8>, in response to the first and second read control signals RX4<1:2> in the second or third mode. The first I/O control circuit 70 may output the input data DIN<1:8> through the first and second I/O lines GIO<1:8>, in response to the first and second write control signals WX4<1:2> in the first mode. The first I/O control circuit 70 may output the input data DIN<1:8> through at least one of the first and second I/O lines GIO<1:8>, in response to the first and second write control signals WX4<1:2> in the second or third mode.

The second I/O control circuit 80 may include a second read control circuit 81 and a second write control circuit 82.

The second read control circuit 81 may output the second read data RD2<1:8> loaded on the third and fourth internal I/O lines BIO2<1:8> through the first and second I/O lines GIO<1:8>, in response to the first and second read control signals RX4<1:2>. The second read control circuit 81 may output the second read data RD2<1:8> loaded on the third and fourth internal I/O lines BIO2<1:8> through the first and second I/O lines GIO<1:8>, in response to the first and second read control signals RX4<1:2> in the first mode. The second read control circuit 81 may output the second read data RD2<1:4> loaded on the third internal I/O line BIO2<1:4> through the first I/O line GIO<1:4>, in response to the first and second read control signals RX4<1:2> during the internal read operation in the second mode. The second read control circuit 81 may output the second read data RD2<5:8> loaded on the fourth internal I/O line BIO2<5:8> through the second I/O line GIO<5:8>, in response to the first and second read control signals RX4<1:2> during the write operation in the second mode. The second read control circuit 81 may output the second read data RD2<5:8> loaded on the fourth internal I/O line BIO2<5:8> through the second I/O line GIO<5:8>, in response to the first and second read control signals RX4<1:2> during the internal read operation in the third mode. The second read control circuit 81 may output the second read data RD2<1:4> loaded on the third internal I/O line BIO2<1:4> through the first I/O line GIO<1:4>, in response to the first and second read control signals RX4<1:2> during the write operation in the third mode. The second read control circuit 81 may be realized to have substantially the same configuration and function as the first read control circuit 71, except that the second read data RD2<1:8> instead of the first read data RD1<1:8> are inputted thereto. That is, the second read control circuit 81 may be designed to perform substantially the same operation as the first read control circuit 71.

The second write control circuit 82 may output the input data DIN<1:8> through at least one of the first and second I/O lines GIO<1:8> in response to the first and second write control signals WX4<1:2>. The second write control circuit 82 may output the input data DIN<1:8> through any one of the first and second I/O lines GIO<1:8>, on which the read data RD2<1:8> are not loaded, in response to the first and second write control signals WX4<1:2> in the first mode. The second write control circuit 82 may output the input data DIN<1:4> through the first I/O line GIO<1:4> in response to the first and second write control signals WX4<1:2> during the write operation in the second mode. The second write control circuit 82 may output the input data DIN<5:8> through the second I/O line GIO<5:8> in response to the first and second write control signals WX4<1:2> during the write operation in the third mode. The second write control circuit 82 may be realized to have substantially the same configuration and function as the first write control circuit 72. That is, the second write control circuit 82 may be designed to perform substantially the same operation as the first write control circuit 72.

The second I/O control circuit 80 may output the second read data RD2<1:8> loaded on the third and fourth internal I/O lines BIO2<1:8> through the first and second I/O lines GIO<1:8>, in response to the first and second read control signals RX4<1:2> in the first mode. The second I/O control circuit 80 may output the second read data RD2<1:8> loaded on the third and fourth internal I/O lines BIO2<1:8> through any one of the first and second I/O lines GIO<1:8>, in response to the first and second read control signals RX4<1:2> in the second or third mode. The second I/O control circuit 80 may output the input data DIN<1:8> through the first and second I/O lines GIO<1:8>, in response to the first and second write control signals WX4<1:2> in the first mode. The second I/O control circuit 80 may output the input data DIN<1:8> through any one of the first and second I/O lines GIO<1:8>, in response to the first and second write control signals WX4<1:2> in the second or third mode.

The first, second, and third modes will be described in detail hereinafter with reference to FIG. 2.

The first mode (x8) may be a case where the first address ADD<1> has a logic "high(H)" level and the second address ADD<2> has a logic "high(H)" level. The first mode (x8) may correspond to a mode that the first and second internal I/O lines BIO1<1:8>, the third and fourth internal I/O lines BIO2<1:8>, and the first and second I/O lines GIO<1:8> are simultaneously activated. In the first mode (x8), the first read data RD1<1:8> and the second read data RD2<1:8> may be outputted as 8-bit data, and the input data DIN<1:8> may be inputted as 8-bit data.

The second mode (x4) may be a case where the first address ADD<1> has a logic "high(H)" level and the second address ADD<2> has a logic "low(L)" level. The second mode (x4) may correspond to a mode that the first internal I/O line BIO1<1:4> and the third internal I/O line BIO2<1:4> are activated and the first I/O line GIO<1:4> is activated. In the second mode (x4), the first read data RD1<1:4> and the second read data RD2<1:4> may be outputted as 4-bit data during the internal read operation, and the input data DIN<1:4> may be inputted as 4-bit data during the write operation.

The third mode (x4) may be a case where the first address ADD<1> has a logic "low(L)" level and the second address ADD<2> has a logic "high(H)" level. The third mode (x4) may correspond to a mode that the second internal I/O line BIO1<5:8> and the fourth internal I/O line BIO2<5:8> are activated and the second I/O line GIO<5:8> is activated. In the third mode (x4), the first read data RD1<5:8> and the second read data RD2<5:8> may be outputted as 4-bit data during the internal read operation, and the input data DIN<5:8> may be inputted as 4-bit data during the write operation.

Figure 3:
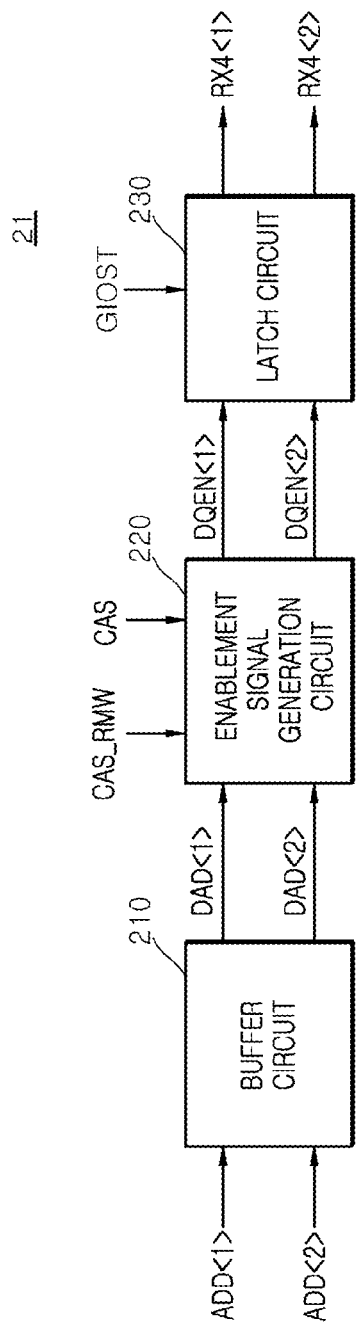
FIG. 3 is a block diagram illustrating a configuration of a read control signal generation circuit included in the semiconductor device of FIG. 1.

Referring to FIG. 3, the read control signal generation circuit 21 may include a buffer circuit 210, an enablement signal generation circuit 220, and a latch circuit 230.

The buffer circuit 210 may buffer the first and second addresses ADD<1:2> to generate a first delayed address DAD<1> and a second delayed address DAD<2>. The buffer circuit 210 may be realized using a general buffer circuit.

The enablement signal generation circuit 220 may buffer the first and second delayed addresses DAD<1:2> to generate a first enablement signal DQEN<1> and a second enablement signal DQEN<2>, in response to a first column signal CAS_RMW which is generated during the internal read operation. The enablement signal generation circuit 220 may inversely buffer the first and second delayed addresses DAD<1:2> to generate the first and second enablement signals DQEN<1:2>, in response to a second column signal CAS which is generated during the write operation.

The latch circuit 230 may latch an I/O strobe signal GIOST generated during the internal read operation and the write operation to generate the first and second read control signals RX4<1:2>, in response to the first and second enablement signals DQEN<1:2>.

Figure 4:
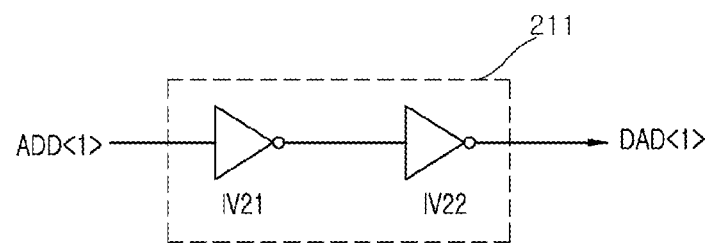
FIG. 4 is a circuit diagram illustrating a configuration of a buffer circuit included in the read control signal generation circuit of FIG. 3.
Figure 4:
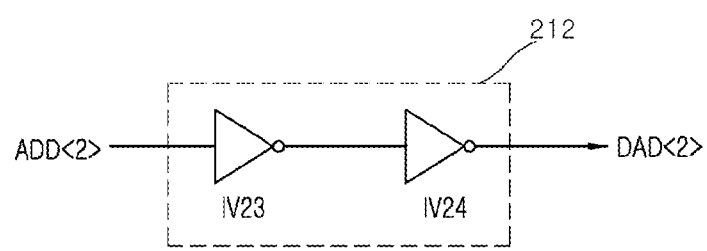

Referring to FIG. 4, the buffer circuit 210 may include a first buffer circuit 211 and a second buffer circuit 212.

The first buffer circuit 211 may be realized to include a couple of inverters IV21 and IV22 which are connected in series. The first buffer circuit 211 may buffer the first address ADD<1> to generate the first delayed address DAD<1>.

The second buffer circuit 212 may be realized to include a couple of inverters IV23 and IV24 which are connected in series. The second buffer circuit 212 may buffer the second address ADD<2> to generate the second delayed address DAD<2>.

Figure 5:
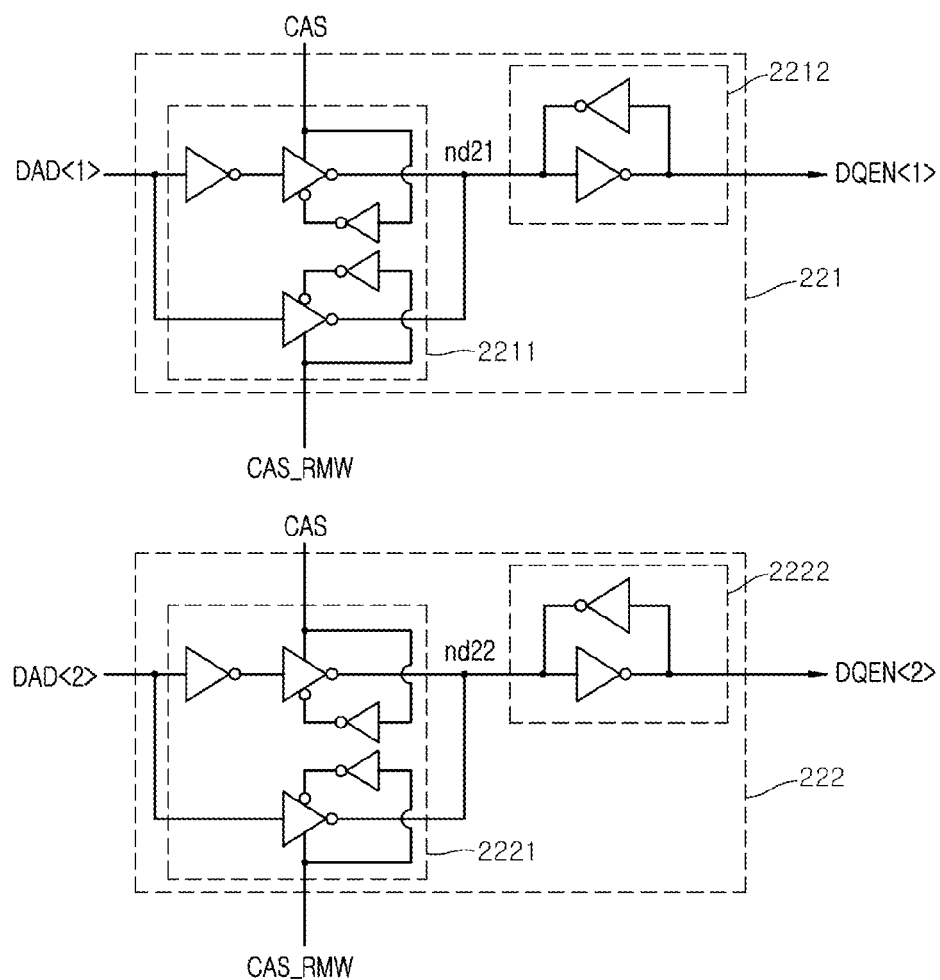
FIG. 5 is a circuit diagram illustrating a configuration of an enablement signal generation circuit included in the read control signal generation circuit of FIG. 3.

Referring to FIG. 5, the enablement signal generation circuit 220 may include a first enablement signal generation circuit 221 and a second enablement signal generation circuit 222.

The first enablement signal generation circuit 221 may include a first signal transfer circuit 2211 and a first latch 2212.

The first signal transfer circuit 2211 may inversely buffer the first delayed address DAD<1> to output the inversely buffered address to a node ND21, in response to the first column signal CAS_RMW. The first signal transfer circuit 2211 may inversely buffer the first delayed address DAD<1> to output the inversely buffered address to the node ND21 if the first column signal CAS_RMW is enabled to have a logic "high" level. The first signal transfer circuit 2211 may buffer the first delayed address DAD<1> to output the buffered address to the node ND21, in response to the second column signal CAS. The first signal transfer circuit 2211 may buffer the first delayed address DAD<1> to output the buffered address to the node ND21 if the second column signal CAS is enabled to have a logic "high" level.

The first latch 2212 may latch a signal of the node ND21. The first latch 2212 may inversely buffer the latched signal to output the inversely buffered signal as the first enablement signal DQEN<1>.

As described above, the first enablement signal generation circuit 221 may buffer the first delayed address DAD<1> to output the buffered signal as the first enablement signal DQEN<1> in response to the first column signal CAS_RMW. In addition, the first enablement signal generation circuit 221 may inversely buffer the first delayed address DAD<1> to output the inversely buffered signal as the first enablement signal DQEN<1> in response to the second column signal CAS.

The second enablement signal generation circuit 222 may include a second signal transfer circuit 2221 and a second latch 2222.

The second signal transfer circuit 2221 may inversely buffer the second delayed address DAD<2> to output the inversely buffered address to a node ND22, in response to the first column signal CAS_RMW. The second signal transfer circuit 2221 may inversely buffer the second delayed address DAD<2> to output the inversely buffered address to the node ND22 if the first column signal CAS_RMW is enabled to have a logic "high" level. The second signal transfer circuit 2221 may buffer the second delayed address DAD<2> to output the buffered address to the node ND22, in response to the second column signal CAS. The second signal transfer circuit 2221 may buffer the second delayed address DAD<2> to output the buffered address to the node ND22 if the second column signal CAS is enabled to have a logic "high" level.

The second latch 2222 may latch a signal of the node ND22. The second latch 2222 may inversely buffer the latched signal to output the inversely buffered signal as the second enablement signal DQEN<2>.

As described above, the second enablement signal generation circuit 222 may buffer the second delayed address DAD<2> to output the buffered signal as the second enablement signal DQEN<2> in response to the first column signal CAS_RMW. In addition, the second enablement signal generation circuit 222 may inversely buffer the second delayed address DAD<2> to output the inversely buffered signal as the second enablement signal DQEN<2> in response to the second column signal CAS.

Figure 6:
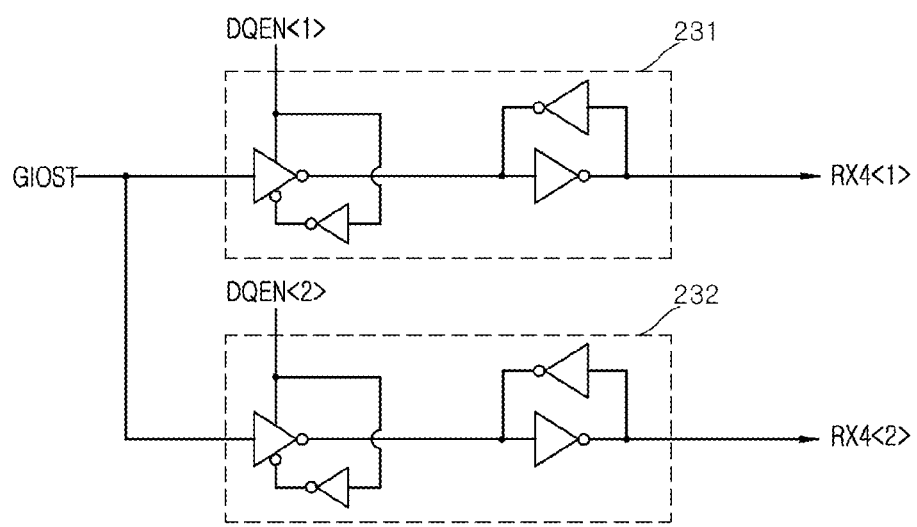
FIG. 6 is a circuit diagram illustrating a configuration of a latch circuit included in the read control signal generation circuit of FIG. 3.

Referring to FIG. 6, the latch circuit 230 may include a first latch circuit 231 and a second latch circuit 232.

The first latch circuit 231 may latch the I/O strobe signal GIOST to output the latched I/O strobe signal as the first read control signal RX4<1>, in response to the first enablement signal DQEN<1>. The first latch circuit 231 may latch the I/O strobe signal GIOST to output the latched I/O strobe signal as the first read control signal RX4<1>, if the first enablement signal DQEN<1> is enabled to have a logic "high" level.

The second latch circuit 232 may latch the I/O strobe signal GIOST to output the latched I/O strobe signal as the second read control signal RX4<2>, in response to the second enablement signal DQEN<2>. The second latch circuit 232 may latch the I/O strobe signal GIOST to output the latched I/O strobe signal as the second read control signal RX4<2>, if the second enablement signal DQEN<2> is enabled to have a logic "high" level.

Figure 7:
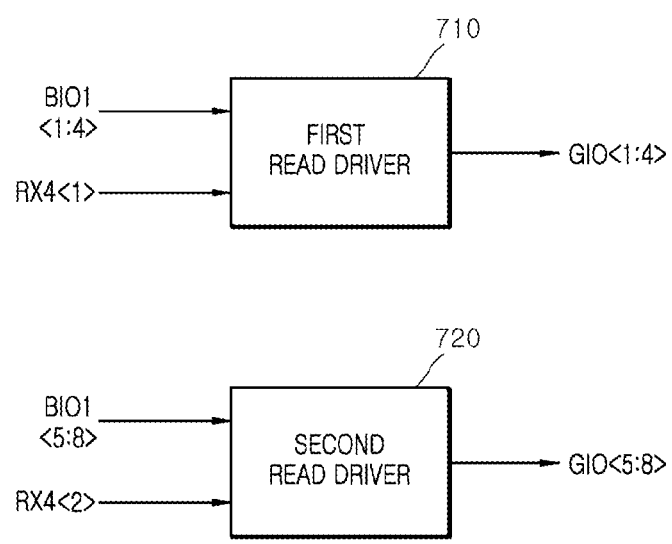
FIG. 7 is a block diagram illustrating a configuration of a first read control circuit included in the semiconductor device of FIG. 1.

Referring to FIG. 7, the first read control circuit 71 may include a first read driver 710 and a second read driver 720.

The first read driver 710 may output the first read data RD1<1:4> loaded on the first internal I/O line BIO1<1:4> through the first I/O line GIO<1:4> in response to the first read control signal RX4<1>. The first read driver 710 may drive a level of the first I/O line GIO<1:4> in response to the first read data RD1<1:4> loaded on the first internal I/O line BIO1<1:4>, if the first read control signal RX4<1> is enabled to have a logic "high" level.

The second read driver 720 may output the first read data RD1<5:8> loaded on the second internal I/O line BIO1<5:8> through the second I/O line GIO<5:8> in response to the second read control signal RX4<2>. The second read driver 720 may drive a level of the second I/O line GIO<5:8> in response to the first read data RD1<5:8> loaded on the second internal I/O line BIO1<5:8>, if the second read control signal RX4<2> is enabled to have a logic "high" level.

Figure 8:
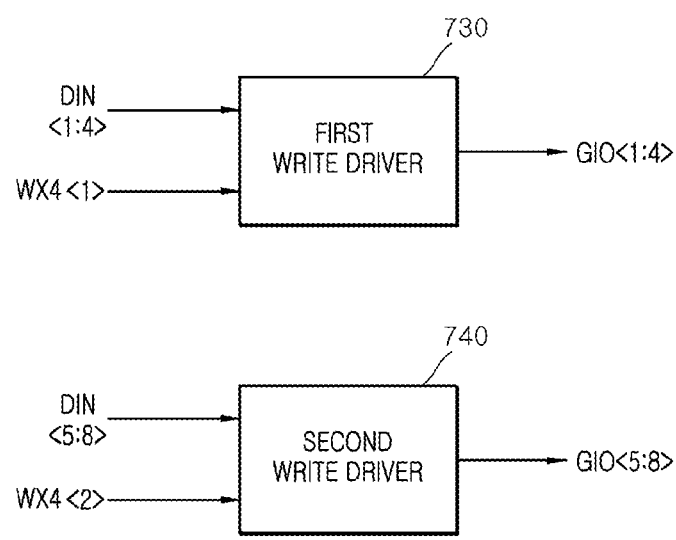
FIG. 8 is a block diagram illustrating a configuration of a first write control circuit included in the semiconductor device of FIG. 1.

Referring to FIG. 8, the first write control circuit 72 may include a first write driver 730 and a second write driver 740.

The first write driver 730 may output the input data DIN<1:4> through the first I/O line GIO<1:4> in response to the first write control signal WX4<1>. The first write driver 730 may drive a level of the first I/O line GIO<1:4> in response to the input data DIN<1:4>, if the first write control signal WX4<1> is enabled to have a logic "high" level.

The second write driver 740 may output the input data DIN<5:8> through the second I/O line GIO<5:8> in response to the second write control signal WX4<2>. The second write driver 740 may drive a level of the second I/O line GIO<5:8> in response to the input data DIN<5:8>, if the second write control signal WX4<2> is enabled to have a logic "high" level.

An operation of the semiconductor device having the aforementioned configuration will be described hereinafter in conjunction with a read-modify-write operation where the internal read operation and the write operation of the first bank 30 are performed in the second mode.

First, the internal read operation will be described hereinafter.

The address decoder 10 may decode the address ADD<1:N> to generate the internal address IAD<1:M>. In such a case, the first address ADD<1> having a logic "high" level is inputted to the semiconductor device, and the second address ADD<2> having a logic "low" level is inputted to the semiconductor device.

The read control signal generation circuit 21 of the control signal generation circuit 20 may buffer the first and second addresses ADD<1:2> to generate the first read control signal RX4<1> having a logic "high" level and the second read control signal RX4<2> having a logic "low" level, during the internal read operation.

The first bank 30 may output the data stored therein as first read data RD1<1:8> according to the internal address IAD<1:M>, in response to the read signal RD which is enabled during the internal read operation.

The error information storage circuit 50 may output the parity signal PRT<1:J> stored therein in response to the read signal RD.

The error correction circuit 60 may correct errors of the first read data RD1<1:8> loaded on the first and second internal I/O lines BIO1<1:8> to output the corrected data through the first and second internal I/O lines BIO1<1:8>, in response to the parity signal PRT<1:J> during the internal read operation.

The first read control circuit 71 of the first I/O control circuit 70 may output the first read data RD1<1:4> loaded on the first internal I/O lines BIO1<1:4> through the first I/O line GIO<1:4>, in response to the first read control signals RX4<1> having a logic "high" level.

Next, the write operation will be described hereinafter.

The address decoder 10 may decode the address ADD<1:N> to generate the internal address IAD<1:M>. In such a case, the first address ADD<1> having a logic "high" level is inputted to the semiconductor device, and the second address ADD<2> having a logic "low" level is inputted to the semiconductor device.

The read control signal generation circuit 21 of the control signal generation circuit 20 may inversely buffer the first and second addresses ADD<1:2> to generate the first read control signal RX4<1> having a logic "low" level and the second read control signal RX4<2> having a logic "high" level, during the write operation. The write control signal generation circuit 22 may buffer the first and second addresses ADD<1:2> to generate the first write control signal WX4<1> having a logic "high" level and the second write control signal WX4<2> having a logic "low" level, during the write operation.

The error correction circuit 60 may correct errors of the first read data RD1<1:8> loaded on the first and second internal I/O lines BIO1<1:8> to output the corrected data through the first and second internal I/O lines BIO1<1:8>, in response to the parity signal PRT<1:J> generated during the internal read operation, during the internal read operation.

The first read control circuit 71 of the first I/O control circuit 70 may output the first read data RD1<5:8> loaded on the second internal I/O lines BIO1<5:8> through the second I/O line GIO<5:8>, in response to the second read control signals RX4<2> having a logic "high" level. The first write control circuit 72 may output the input data DIN<1:4> through the first I/O line GIO<1:4>, in response to the first write control signals WX4<1> having a logic "high" level during the write operation.

The error correction circuit 60 may generate the parity signal PRT<1:J> including information on errors of the input data DIN<1:4> loaded on the first I/O line GIO<1:4> during the write operation. The error correction circuit 60 may correct errors of the input data DIN<1:4> loaded on the first I/O line GIO<1:4> to output the corrected input data through the first I/O line GIO<1:4> during the write operation.

The error information storage circuit 50 may store the parity signal PRT<1:J> including information on errors of the input data DIN<1:4>, in response to the write signal WT.

The first bank 30 may store the input data DIN<1:4> loaded on the first I/O line GIO<1:4> and the first read data RD1<5:8> loaded on the second I/O line GIO<5:8> according to the internal address IAD<1:M>, in response to the write signal WT which is enabled during the write operation.

As described above, a semiconductor device according to an embodiment may perform an internal read operation using an I/O line which is not used during a read-modify-write operation and may perform a write operation using an I/O line which is used during the read-modify-write operation. Thus, the time necessary for performing the read-modify-write operation may be reduced.

Figure 9:
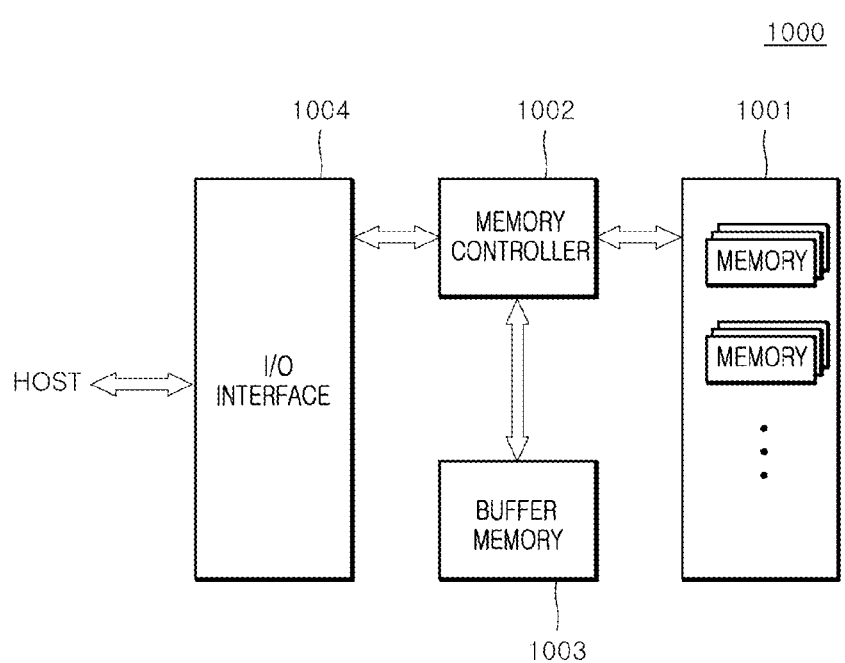
FIG. 9 is a block diagram illustrating a configuration of an electronic system employing a semiconductor device described with reference to FIGS. 1 to 8.

The semiconductor device described with reference to FIGS. 1 to 8 may be applied to an electronic system that includes a memory system, a graphic system, a computing system, a mobile system, or the like. For example, as illustrated in FIG. 9, an electronic system 1000 according an embodiment may include a data storage circuit 1001, a memory controller 1002, a buffer memory 1003, and an input/output (I/O) interface 1004.

The data storage circuit 1001 may store data which is outputted from the memory controller 1002 or may read and output the stored data to the memory controller 1002, according to a control signal generated from the memory controller 1002. The data storage circuit 1001 may include the semiconductor device illustrated in FIG. 1. Meanwhile, the data storage circuit 1001 may include a nonvolatile memory that can retain stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 9 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which is processed by the memory controller 1002. That is, the buffer memory 1003 may temporarily store the data which is outputted from or to be inputted to the data storage circuit 1001. The buffer memory 1003 may store the data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB) drive, a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB drive, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 10:
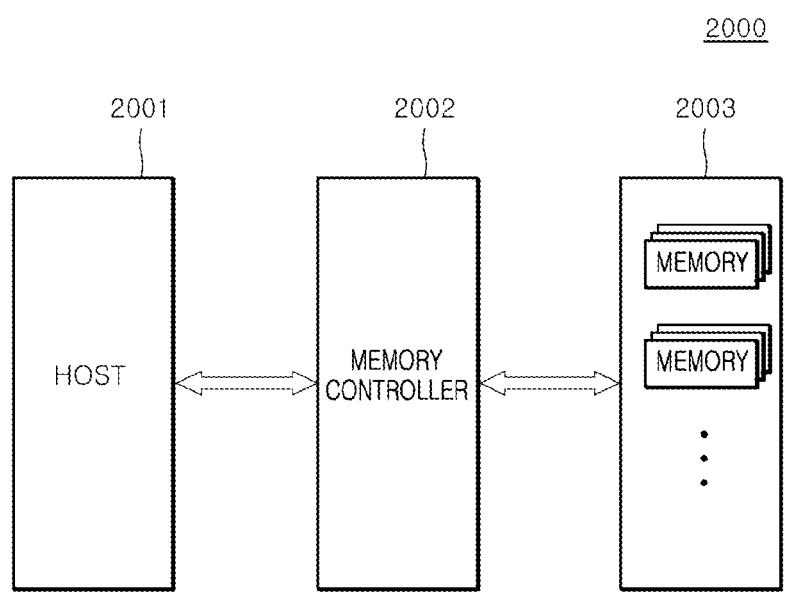
FIG. 10 is a block diagram illustrating a configuration of another electronic system employing a semiconductor device described with reference to FIGS. 1 to 8.

Referring to FIG. 10, an electronic system 2000 according another embodiment may include a host 2001, a memory controller 2002, and a data storage circuit 2003.

The host 2001 may output a request signal and data to the memory controller 2002 to access the data storage circuit 2003. The memory controller 2002 may supply the data, a data strobe signal, a command, addresses, and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data outputted from the data storage circuit 2003 through the memory controller 2002. The host 2001 may include a circuit that corrects errors of the data using an error correction code (ECC) scheme.

The memory controller 2002 may act as an interface that connects the host 2001 to the data storage circuit 2003 for communication between the host 2001 and the data storage circuit 2003. The memory controller 2002 may receive the request signal and the data outputted from the host 2001 and may generate and supply the data, the data strobe signal, the command, the addresses, and the clock signal to the data storage circuit 2003 in order to control operations of the data storage circuit 2003. In addition, the memory controller 2002 may supply the data outputted from the data storage circuit 2003 to the host 2001.

The data storage circuit 2003 may include a plurality of memories. The data storage circuit 2003 may receive the data, the data strobe signal, the command, the addresses, and the clock signal from the memory controller 2002 to execute the write operation or the read operation. Each of the memories included in the data storage circuit 2003 may include a circuit that corrects the errors of the data using an error correction code (ECC) scheme. The data storage circuit 2003 may include the semiconductor device illustrated in FIG. 1.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a single chip according to the embodiments. The memory controller 2002 and the data storage circuit 2003 may be realized in a single chip according to the embodiments.

What is claimed is:

1. A semiconductor device comprising:
   a control signal generation circuit configured to generate first and second read control signals, one of which is selectively enabled and first and second write control signals, one of which is selectively enabled, according to a combination of first and second addresses for selecting a first input/output (I/O) line or a second I/O line; and
   an I/O control circuit configured to output read data loaded on first and second internal I/O lines through any one of the first and second I/O lines in response to the first and second read control signals, and configured to output input data through any one of the first and second I/O lines in response to the first and second write control signals.

2. The semiconductor device of claim 1, wherein the input data are outputted through any one of the first I/O line and the second I/O line, on which the read data are not loaded.

3. The semiconductor device of claim 1, wherein the control signal generation circuit includes:
   a read control signal generation circuit configured to buffer the first and second addresses to generate the first and second read control signals during an internal read operation, and configured to inversely buffer the first and second addresses to generate the first and second read control signals during a write operation; and
   a write control signal generation circuit configured to buffer the first and second addresses to generate the first and second write control signals during the internal read operation or the write operation.

4. The semiconductor device of claim 3, wherein the read control signal generation circuit includes:
   a buffer circuit configured to buffer the first and second addresses to generate a first delayed address and a second delayed address;
   an enablement signal generation circuit configured to buffer the first and second delayed addresses to generate a first enablement signal and a second enablement signal in response to a first column signal which is generated during the internal read operation, or configured to inversely buffer the first and second delayed addresses to generate the first and second enablement signals in response to a second column signal which is generated during the write operation; and
   a latch circuit configured to latch an I/O strobe signal generated during the internal read operation or the write operation to generate the first and second read control signals in response to the first and second enablement signals.

5. The semiconductor device of claim 4, wherein the buffer circuit includes:
   a first buffer circuit configured to buffer the first address to generate the first delayed address; and
   a second buffer circuit configured to buffer the second address to generate the second delayed address.

6. The semiconductor device of claim 4, wherein the enablement signal generation circuit includes:
   a first enablement signal generation circuit configured to buffer the first delayed address to output the buffered signal as the first enablement signal in response to the first column signal and configured to inversely buffer the first delayed address to output the inversely buffered signal as the first enablement signal in response to the second column signal; and
   a second enablement signal generation circuit configured to buffer the second delayed address to output the buffered signal as the second enablement signal in response to the first column signal and configured to inversely buffer the second delayed address to output the inversely buffered signal as the second enablement signal in response to the second column signal.

7. The semiconductor device of claim 4, wherein the latch circuit includes:
   a first latch circuit configured to latch the I/O strobe signal to output the latched I/O strobe signal as the first read control signal, in response to the first enablement signal; and
   a second latch circuit configured to latch the I/O strobe signal to output the latched I/O strobe signal as the second read control signal, in response to the second enablement signal.

8. The semiconductor device of claim 1, wherein the I/O control circuit includes:
   a read control circuit configured to output the read data loaded on the first and second internal I/O lines through one of the first and second I/O lines, in response to the first and second read control signals; and
   a write control circuit configured to output the input data through one of the first and second I/O lines, in response to the first and second write control signals.

9. The semiconductor device of claim 8, wherein the read control circuit includes:
   a first read driver configured to output the read data loaded on the first internal I/O line through the first I/O line in response to the first read control signal; and
   a second read driver configured to output the read data loaded on the second internal I/O line through the second I/O line in response to the second read control signal.

10. The semiconductor device of claim 8, wherein the write control circuit includes:
    a first write driver configured to output the input data through the first I/O line in response to the first write control signal; and
    a second write driver configured to output the input data through the second I/O line in response to the second write control signal.

11. A semiconductor device comprising:
    a control signal generation circuit configured to generate first and second read control signals and first and second write control signals, which are simultaneously enabled if a combination of first and second addresses corresponds to a first mode, and configured to generate the first and second read control signals, one of which is selectively enabled and the first and second write control signals, one of which is selectively enabled, if a combination of the first and second addresses corresponds to a second mode or a third mode; and an input/output (I/O) control circuit configured to output read data loaded on first and second internal I/O lines through first and second I/O lines in response to the first and second read control signals, and configured to output input data through the first and second I/O lines in response to the first and second write control signals.

12. The semiconductor device of claim 11,
wherein if the number of bits included in the read data and the number of bits included in the input data are "N" in the first mode, the number of bits included in the read data and the number of bits included in the input data are "N/2" in the second or third mode (where, "N" denotes a natural number and an even number).

13. The semiconductor device of claim 11, wherein the control signal generation circuit includes:

a read control signal generation circuit configured to buffer the first and second addresses to generate the first and second read control signals during an internal read operation, and configured to inversely buffer the first and second addresses to generate the first and second read control signals during a write operation; and a write control signal generation circuit configured to buffer the first and second addresses to generate the first and second write control signals during the internal read operation or the write operation.

14. The semiconductor device of claim 13, wherein the read control signal generation circuit includes:

a buffer circuit configured to buffer the first and second addresses to generate a first delayed address and a second delayed address;

an enablement signal generation circuit configured to buffer the first and second delayed addresses to generate a first enablement signal and a second enablement signal in response to a first column signal which is generated during the internal read operation, or configured to inversely buffer the first and second delayed addresses to generate the first and second enablement signals in response to a second column signal which is generated during the write operation; and a latch circuit configured to latch an I/O strobe signal generated during the internal read operation or the write operation to generate the first and second read control signals in response to the first and second enablement signals.

15. The semiconductor device of claim 14, wherein the buffer circuit includes:

a first buffer circuit configured to buffer the first address to generate the first delayed address; and a second buffer circuit configured to buffer the second address to generate the second delayed address.

16. The semiconductor device of claim 14, wherein the enablement signal generation circuit includes:

a first enablement signal generation circuit configured to buffer the first delayed address to output the buffered signal as the first enablement signal in response to the first column signal, and configured to inversely buffer the first delayed address to output the inversely buffered signal as the first enablement signal in response to the second column signal; and a second enablement signal generation circuit configured to buffer the second delayed address to output the buffered signal as the second enablement signal in response to the first column signal, and configured to inversely buffer the second delayed address to output the inversely buffered signal as the second enablement signal in response to the second column signal.

17. The semiconductor device of claim 14, wherein the latch circuit includes:

a first latch circuit configured to latch the I/O strobe signal to output the latched I/O strobe signal as the first read control signal, in response to the first enablement signal; and a second latch circuit configured to latch the I/O strobe signal to output the latched I/O strobe signal as the second read control signal, in response to the second enablement signal.

18. The semiconductor device of claim 11, wherein the I/O control circuit includes:

a read control circuit configured to output the read data loaded on the first and second internal I/O lines through one of the first and second I/O lines, in response to the first and second read control signals; and a write control circuit configured to output the input data through one of the first and second I/O lines, in response to the first and second write control signals.

19. The semiconductor device of claim 18, wherein the read control circuit includes:

a first read driver configured to output the read data loaded on the first internal I/O line through the first I/O line in response to the first read control signal; and a second read driver configured to output the read data loaded on the second internal I/O line through the second I/O line in response to the second read control signal.

20. The semiconductor device of claim 18, wherein the write control circuit includes:

a first write driver configured to output the input data through the first I/O line in response to the first write control signal; and a second write driver configured to output the input data through the second I/O line in response to the second write control signal.

* * * * *